(12) United States Patent
Farid et al.

(10) Patent No.: US 10,090,848 B1
(45) Date of Patent: Oct. 2, 2018

(54) DATA CONVERTERS SYSTEMATIC ERROR CALIBRATION USING ON CHIP GENERATED PRECISE REFERENCE SIGNAL

(71) Applicant: GOODIX TECHNOLOGY INC., San Diego, CA (US)

(72) Inventors: Ali Farid, San Diego, CA (US); Ahmed Emira, San Diego, CA (US); Hassan Elwan, San Diego, CA (US); Mohamed Aboudina, San Diego, CA (US); Janakan Sivasubramaniam, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/871,060

(22) Filed: Jan. 14, 2018

(51) Int. Cl.
*H03M 1/82* (2006.01)
*H03M 1/10* (2006.01)
*H03M 1/46* (2006.01)

(52) U.S. Cl.
CPC ......... *H03M 1/1009* (2013.01); *H03M 1/462* (2013.01); *H03M 1/464* (2013.01)

(58) Field of Classification Search
CPC ..... H03M 1/1009; H03M 1/462; H03M 1/464
USPC .................. 341/120, 135, 143, 163, 166–167
See application file for complete search history.

(56) References Cited

U.S. PATENT DOCUMENTS

| | | | |
|---|---|---|---|
| 8,004,445 B2* | 8/2011 | Oshima | H03M 1/1009 341/158 |
| 8,970,408 B2* | 3/2015 | Bogner | G01R 31/2884 341/118 |

* cited by examiner

*Primary Examiner* — Khai M Nguyen
(74) *Attorney, Agent, or Firm* — Kilpatrick Townsend & Stockton, LLP

(57) ABSTRACT

A self-calibrating analog-to-digital converter includes a reference signal circuit configured to provide a reference signal, an analog-to-digital converter configured to generate a first digital representation of the reference signal, a dual-slope analog-to-digital converter configured to generate a second digital representation of the reference signal, and a digital engine configured to compare the first digital representation with the second digital representation to obtain a difference and output a calibration signal to the analog-to-digital converter in response to the difference. The reference signal circuit, the analog-to-digital converter, the dual-slop analog-to-digital converter, and digital engine are integrated in an integrated circuit.

18 Claims, 10 Drawing Sheets

DATA CONVERTERS SYSTEMATIC ERROR CALIBRATION USING ON CHIP GENERATED PRECISE REFERENCE SIGNAL

FIELD OF THE INVENTION

This invention relates to analog-to-digital conversion, and more particularly to an apparatus and method for calibrating an analog-to-digital converter.

BACKGROUND OF THE INVENTION

An analog-to-digital converter (ADC) is used to convert an analog input signal to a digital output signal. Ideally, the digital output signal provides an accurate representation of the analog input signal. However, in practice, the digital output signal of the ADC does not accurately represent the analog input signal. In other words, the ADC fails to provide a linear response to the analog input signal. There are many sources of error in an ADC. For example, systematic errors may exist in an ADC due to mismatch between components, e.g., active (amplifiers) or passive (resistors, capacitors) devices. The mismatch causes degradation in the static performance of the ADC that may be represented by the integral non-linearity (INL) and differential non-linearity (DNL). Systematic errors become more severe for high-resolution ADCs and limit the ENOB of the ADCs.

There are several different types of ADCs including successive approximation register (SAR) ADCs, pipeline ADCs, flash ADCs, sigma-delta ADCs, VCO-based ADCs, etc. In a SAR ADC, the dominant source of systematic errors may be the mismatch in capacitors that may cause errors in gain, offset, and limit the INL and DNL. In a pipeline ADC, the dominant source of static errors may be the mismatch between active devices in gain stages, amplifiers, comparators, and/or in current steering DAC. In a VCO-based ADC, the dominant source of systematic errors may be in the mismatch between active devices in gm stages and in gm-C values in ring oscillators.

To obtain good static performance that is characterized by the INL and DNL, an ADC is typically subjected to an initial calibration during manufacture. For example, to measure the INL/DNL, a high-precision DC voltage ramp with a step size of 1-LSB or a precise low-frequency sinusoidal reference signal is provided to the input of the ADC. The need of a high-precision DC signal or sinusoidal reference signal requires that the measurement and calibration of the ADC be performed in a fixed location (e.g., a calibration lab). This calibration procedure requires precise and expensive measuring components and cannot be performed on-chip by the ADC.

BRIEF SUMMARY OF THE INVENTION

One aspect of the present invention provides a circuit that enables a self-calibration of an ADC, where the circuit is integrated together with the ADC. The ADC can be self-calibrated without using external high-precision components. According to the present invention, the self-calibration of the ADC can be performed without knowing the actual parameters of the reference signals.

Another aspect of the present invention provides a method for self-calibration of an ADC that does not require any external high-precision and expensive measuring components.

In one embodiment, a self-calibrating analog-to-digital converter includes a reference signal circuit configured to provide a reference signal, an analog-to-digital converter configured to generate a first digital representation of the reference signal, a dual-slope analog-to-digital converter configured to generate a second digital representation of the reference signal, and a digital engine configured to compare the first digital representation with the second digital representation to obtain a difference and output a calibration signal to the analog-to-digital converter in response to the difference. The reference signal circuit, the analog-to-digital converter, the dual-slop analog-to-digital converter, and digital engine are integrated in an integrated circuit.

Embodiments of the present invention also provide a circuit for calibration of an analog-to-digital converter. The circuit includes a ramp reference signal circuit configured to generate a linearly increasing voltage signal, a sample-and-hold circuit having an input terminal coupled to the ramp reference signal circuit and configured to generate a plurality of voltage signals having linearly higher voltage levels at an output terminal, the analog-to-digital converter coupled to the output terminal of the sample-and-hold circuit and configured to generate a set of first digital codes of the plurality of voltage signals, a dual-slope analog-to-digital converter coupled to the output terminal of the sample-and-hold circuit and configured to generate a set of second digital codes of the plurality of voltage signals, and a digital engine configured to compute a difference between the set of first digital codes and the set of second digital codes and provide a set of third digital codes corresponding to a difference signal. The ramp reference signal circuit, the sample-and-hold circuit, the analog-to-digital converter, the dual-slope analog-to-digital converter, and digital engine are integrated in an integrated circuit.

Embodiments of the present invention also provide a method for calibrating an analog-to-digital converter. The method includes providing a reference signal having a linearly increasing voltage level, converting the reference signal to a set of first digital codes by the analog-to-digital converter, converting the reference signal to a set of second digital codes by a dual-slope analog-to-digital converter, computing a difference between the set of first digital codes and the set of second digital codes to obtain a set of third digital codes indicative of a difference signal by a digital engine, and calibrating the analog-to-digital converter in response to the set of third digital codes.

The following detailed description together with the accompanying drawings will provide a better understanding of the nature and advantages of the present invention.

BRIEF DESCRIPTION OF THE DRAWINGS

The accompanying drawings, referred to herein and constituting a part hereof, illustrate embodiments of the disclosure. The drawings together with the description serve to explain the principles of the invention.

DETAILED DESCRIPTION OF THE INVENTION

Figure 1:
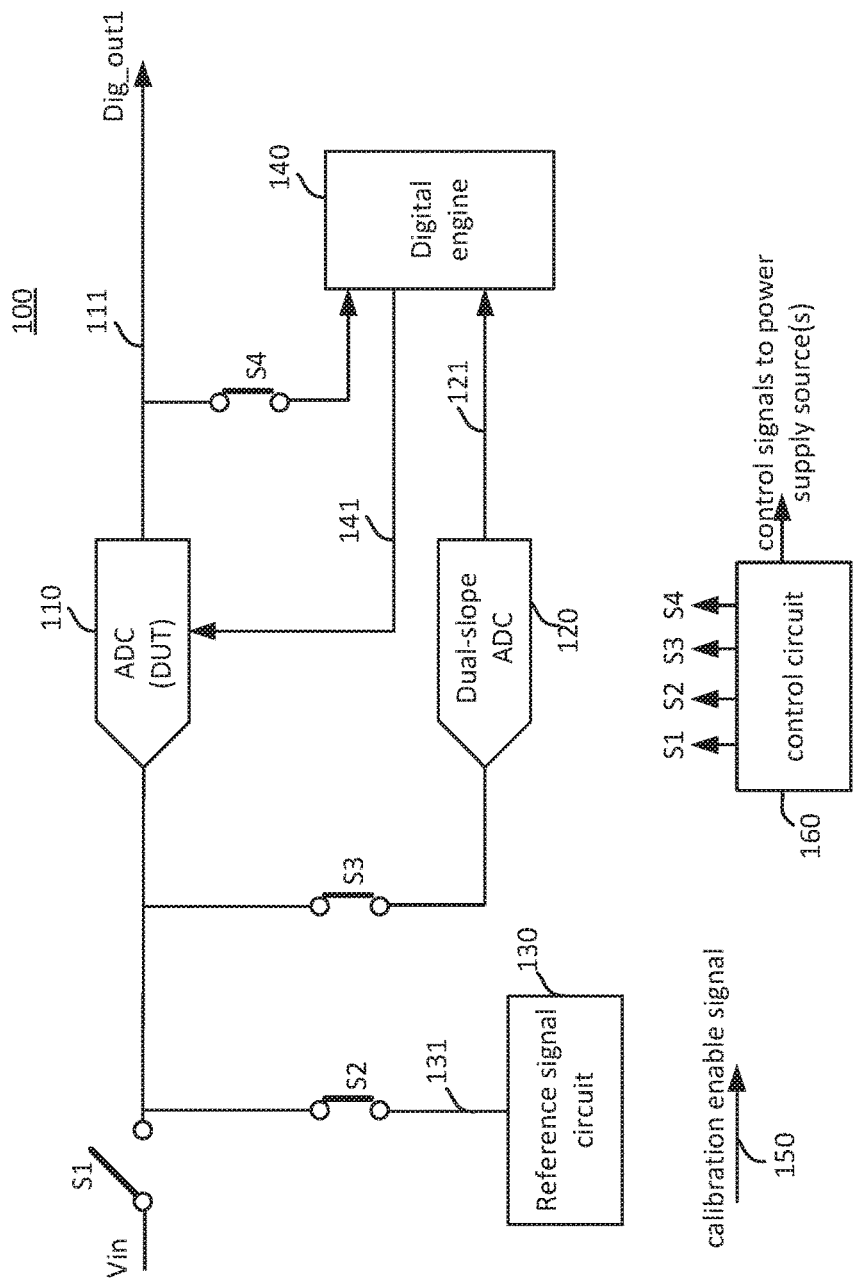
FIG. 1 is a simplified block diagram of a self-calibrating ADC circuit according to an embodiment of the present invention.

Embodiments of the present disclosure now will be described more fully hereinafter with reference to the accompanying drawings. The disclosure may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that, when an element or component is referred to as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It should be understood that each specific numerical value provided herein is to be construed as merely illustrative and not as a limitation. Accordingly, other examples of exemplary embodiments may have different values.

FIG. 1 is a simplified block diagram of a self-calibrating ADC circuit 100 according to an embodiment of the present invention. ADC circuit 100 includes an ADC 110 that needs to be calibrated, a dual-slope ADC 120, a reference signal circuit 130, a digital engine 140, and a plurality of switches (e.g., switches S1, S2, S3, S4). In one embodiment, switch S1 is open, and switches S2, S3, and S4 are closed when ADC circuit 100 is in a calibration mode. In one embodiment, switch S1 is closed, and switches S2, S3, and S4 are open when ADC circuit 100 is in a normal operation mode. In one embodiment, switches S1, S2, S3, S4 may be controlled by respective control signals provided by a control circuit 160. In another embodiment, switches S1, S2, S3, S4 may be controlled by control signals provided by digital engine 140, i.e., control circuit 160 is embedded in digital engine 140. In one embodiment, digital engine 140 may include one or more of a digital circuit, a microcontroller, a CPU, a memory configured to store instructions that are executable by the CPU.

In the calibration mode, reference signal circuit 130 provides a reference signal 131 to ADC 110 and dual-slope ADC 120. ADC 110 converts reference signal 131 to a first digital representation 111 and provides first digital representation 111 to digital engine 140. Similarly, Dual-slope ADC 120 converts reference signal 131 to a second digital representation 121 and provides second digital representation 121 to digital engine 140. Digital engine 140 is configured to compute a difference between first digital representation 111 and second digital representation 121 and provide a calibration signal 141 to ADC 110 in response to the difference. In one embodiment, ADC 110 may correct first digital representation 111 in response to calibration signal 141.

In one embodiment, ADC circuit 100 may further include a calibration enable signal 150 that, when asserted, will place ADC circuit 100 in the calibration mode, and when de-asserted, will place ADC circuit 100 in the normal operation mode. In one embodiment, when ADC circuit 100 is in the normal operation mode, a power supply source (e.g., either Vdd, Vss, or both) to dual-slope ADC 120, reference signal circuit 130, and digital engine 140 is disconnected by turning off corresponding switches (not shown) in addition to turning off switches S2, S3, and S4. In one embodiment, switches (S1, S2, S3, S4) and switches for turning on and off of the power supply source(s) may be electronic switches comprising one or more MOS transistors.

Figure 1A:
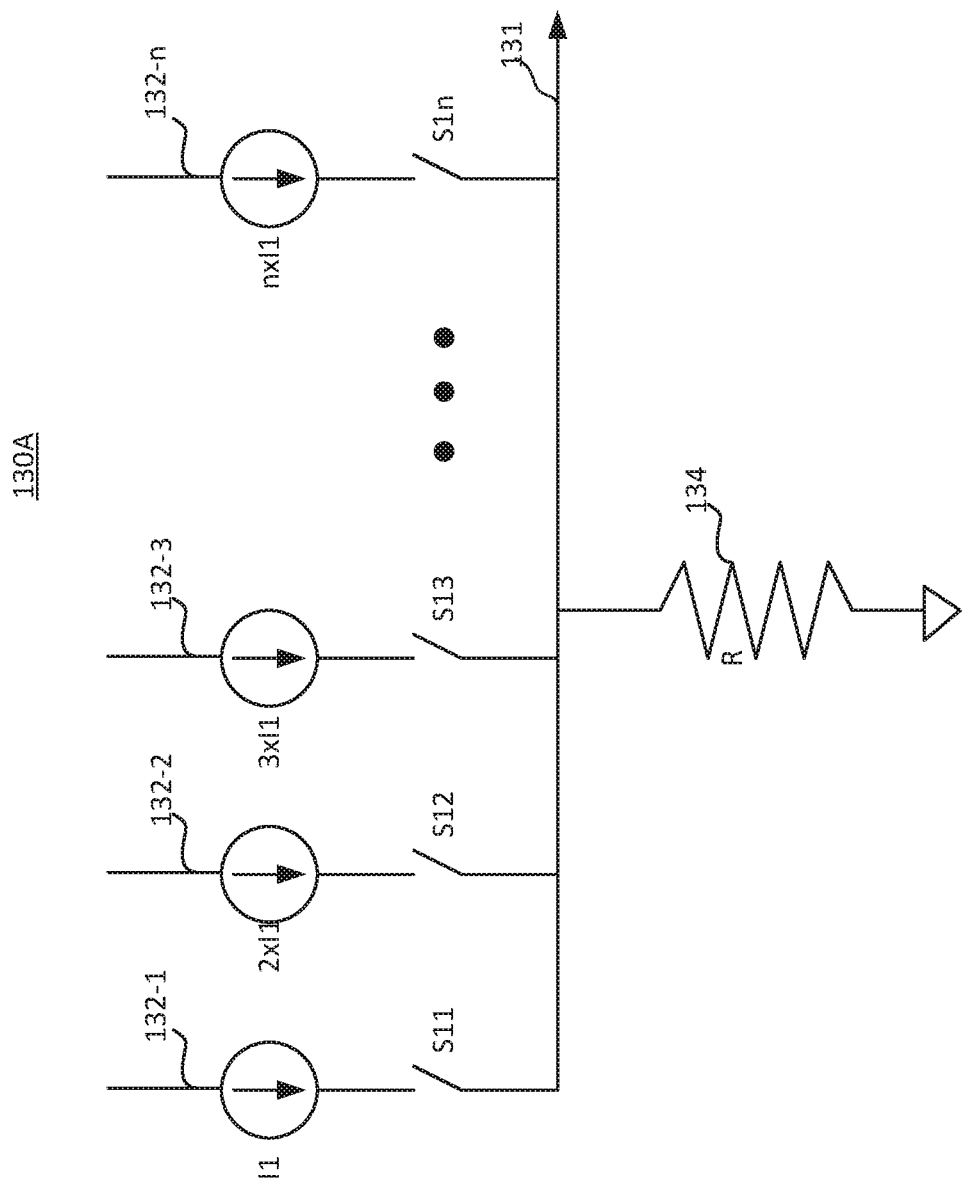
FIG. 1A is a simplified circuit diagram of a reference signal circuit according to an embodiment of the present invention.

FIG. 1A is a simplified circuit diagram of a reference signal circuit 130A according to an embodiment of the present invention. Reference signal circuit 130A may include a current mirror circuit having a reference current 132-1 and a plurality of current mirrors (132-2, 132-3, . . . , 132-n) coupled to a resistor 134 through a plurality of switches (S11, S12, . . . , S1n). In one embodiment, reference signal circuit 130A provides a stable reference signal 131 by flowing reference current 132-1 through resistor 134. In one embodiment, the product of reference current 132-1 and resistor 134 provides a voltage level at reference signal 131 that is substantially equal to 1 LSB of dual-slope ADC 120. In one embodiment, the plurality of current mirrors 132-2, 132-3, . . . , 132-n may be integer multiples of reference current 131-1, i.e., current mirrors 132-2, 132-3, . . . , 132-n may be 2×I1, 3×I1, . . . , n×I1, where I1 is the current value of reference current 132-1. By turning on switches S11, S12, . . . , S1n, reference signal circuit 130A can generate a plurality of discrete and stable voltage signals corresponding to analog input values of 1×LSB, 2×LSB, . . . , n×LSB.

Figure 2:
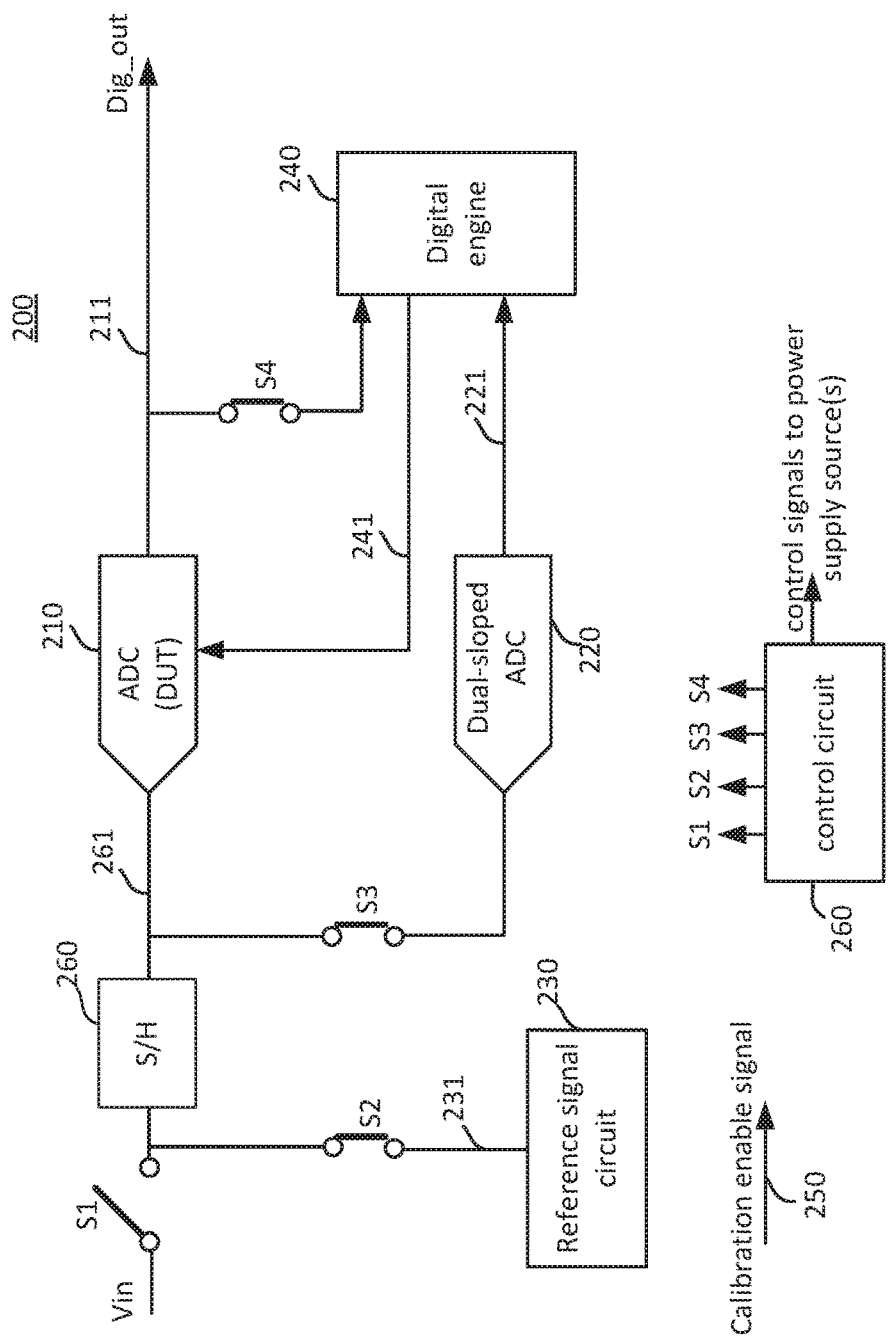
FIG. 2 is a simplified block diagram of a self-calibrating ADC circuit according to another embodiment of the present invention.

FIG. 2 is a simplified block diagram of a self-calibrating ADC circuit 200 according to another embodiment of the present invention. In one embodiment, ADC circuit 200 may operate in a substantially similar manner as described in connection with ADC circuit 100. In some embodiment, ADC circuit 200 may operate in a different manner than ADC 100. ADC circuit 200 includes an ADC 210, a dual-slope ADC 220, and a digital engine 240. ADC circuit 200 further includes a reference signal circuit 230 and a sample-and-hold circuit 260 disposed between reference signal circuit 230 and ADC 210 and dual-slope ADC 220. FIG. 2 illustrates the case where ADC (DUT) 210 and dual-sloped ADC 220 do not have a built-in sample-and-hold circuit so that sample-and-hold circuit 260 is used to sample reference signal 231 and hold the sampled value for a short interval of time until reference signal 231 is sampled again. In one embodiment, reference signal circuit 230 is configured to generate a linear continuously ramping voltage signal 231, namely reference signal 231. Sample-and-hold circuit 260 is configured to provide a plurality of voltage signals 261 that have linearly higher voltage levels to ADC 210 and dual-slope ADC 220.

Figures 2A, 2B:
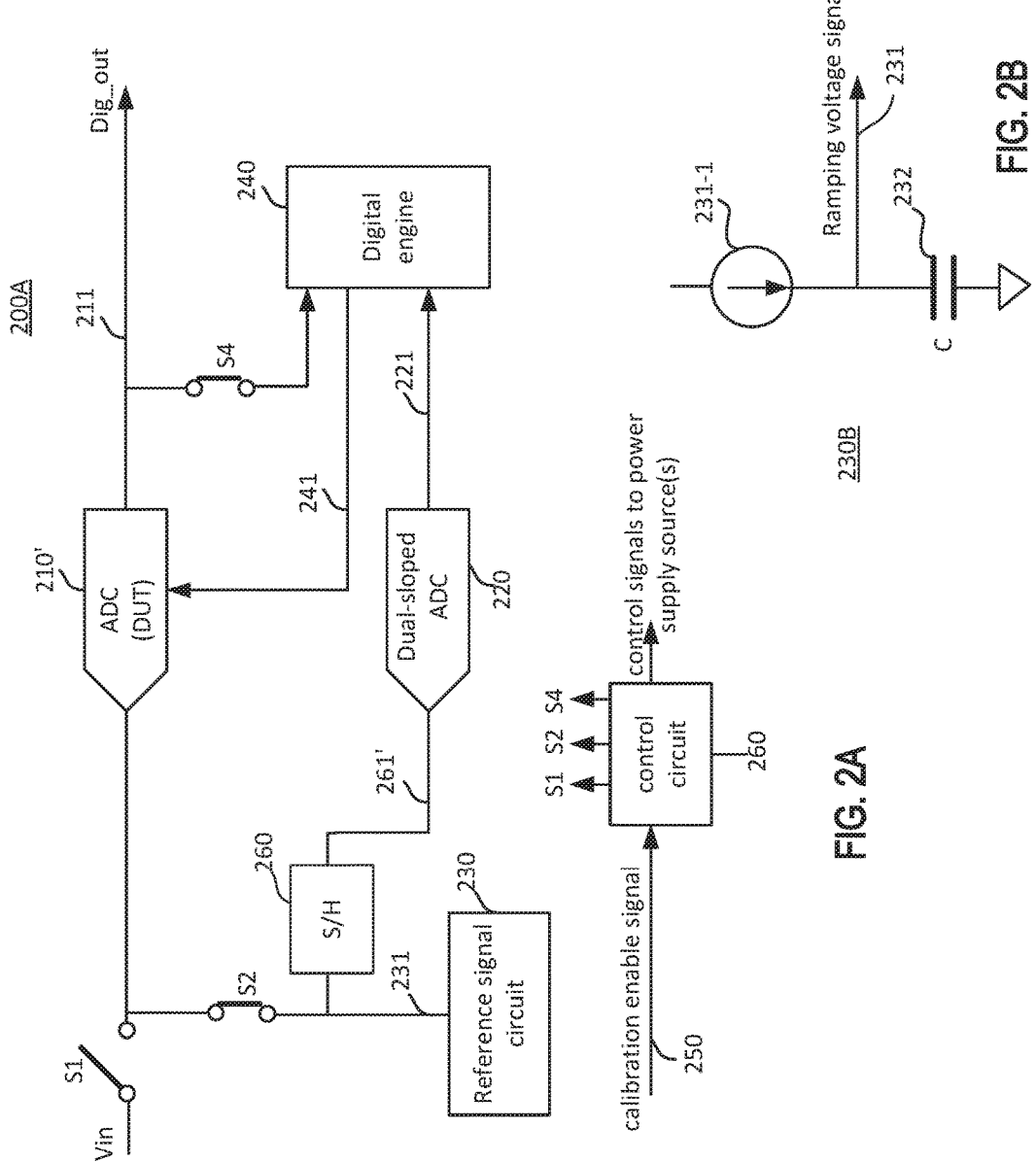
FIG. 2A is a simplified block diagram of a self-calibrating ADC circuit according to yet another embodiment of the present invention.
FIG. 2B is a simplified circuit diagram of a reference signal circuit according to another embodiment of the present invention.

FIG. 2A is a simplified block diagram of a self-calibrating ADC circuit 200A according to yet another embodiment of the present invention. FIG. 2A illustrates the case where ADC (DUT) 210' has a built-in sample-and-hold (S/H) circuit. For example, ADC 210' may be a successive approximation register (SAR) type ADC that uses an S/H circuit to hold the input value until the analog-to-digital conversion is completed. In this embodiment, sample-and-hold circuit 260 is disposed between reference signal circuit 230 and dual-sloped ADC 220 and configured to provide a sampled signal 261' to dual-sloped ADC 220. Reference signal circuit 230, sample-and-hold circuit 260, dual-sloped ADC 220, and digital engine 240 are the same as the one shown and described in FIG. 2, and their description is omitted herein for the sake of brevity. Control circuit 260 may be external to digital engine 240 or implemented within digital engine 240. In one embodiment, control circuit 260 may include switches, such as S1, S2, S4, and other switches to connect and disconnect a power supply source to the reference signal, the dual-sloped ADC, the sample-and-hold circuit, the digital engine in response to the calibration enable signal. In one embodiment, digital engine 240 may include dedicated hardware in combination with a central processor unit (CPU), software, and memory to implement functions of receiving digital codes 211 of ADC 210' and 221 of dual-sloped ADC, computing the difference between the digital codes 211 and 221, storing the difference at a location of the memory, and providing a calibration signal 241 to ADC 210' based on the difference.

FIG. 2B is a simplified circuit diagram of a reference signal circuit 230B according to another embodiment of the present invention. Reference signal circuit 230B includes a stable reference current 231-1 coupled to a capacitor 232 and configured to provide linear continuously ramping voltage signal 231.

Figure 3A:
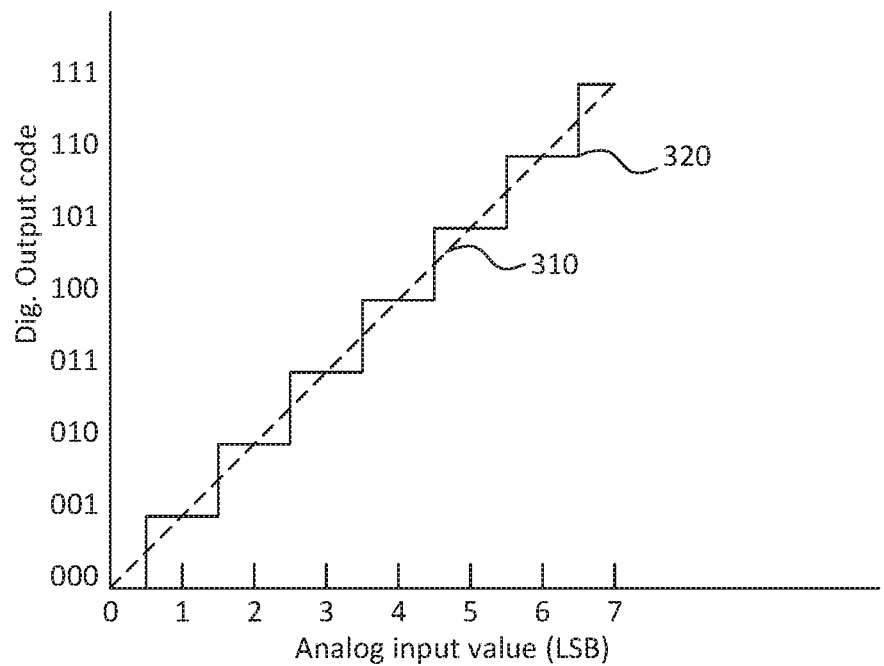
FIG. 3A is a graph illustrating an analog input signal vs. a digital output signal of an ideal ADC.

FIG. 3A is a graph illustrating an analog input signal vs. a digital output signal of an ideal ADC. The x-axis represents the value of an analog input signal in LSB units, and the y-axis represents the corresponding digital output codes of a digital output signal. The dashed diagonal line 310 represents a linear, non-quantized output response for the analog input signal. The corresponding output of the ideal ADC is represented by the stair stepped line 320. The corresponding output of the ideal ADC tracks the analog input signal accurately according to a predetermined quantization level, i.e., the resolution of the ADC.

Figure 3B:
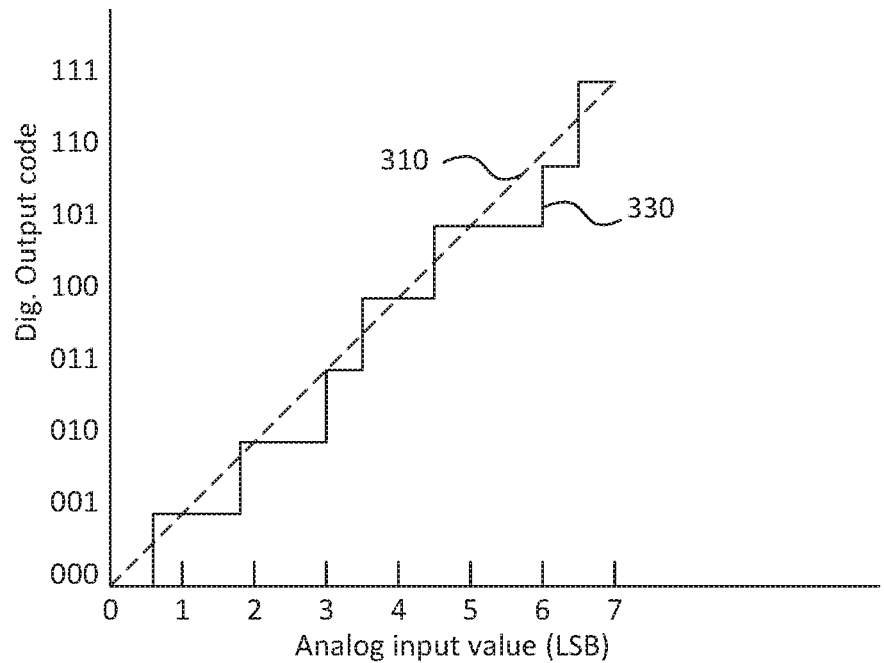
FIG. 3B is a graph illustrating an analog input signal vs. a digital output signal of a practical ADC.

FIG. 3B is a graph illustrating an analog input signal vs. a digital output signal of a practical ADC. The x-axis represents the value of an analog input signal in LSB units, and the y-axis represents the corresponding digital output codes of a digital output signal. The dashed diagonal line 310 represents again a linear, non-quantized output response for the analog input signal. The corresponding output of the practical ADC is represented by a distorted stair-stepped line 330 that does not track the analog input signal the same manner as does the ideal ADC. Thus, the effective number of bit (ENOB) of an n-bit ADC may differ from the actual n number of bits due to errors, e.g., offset errors, gain errors, and linearity errors. The ADC circuits of exemplary embodiments of the present invention can reduce or eliminate such errors.

Figure 4:
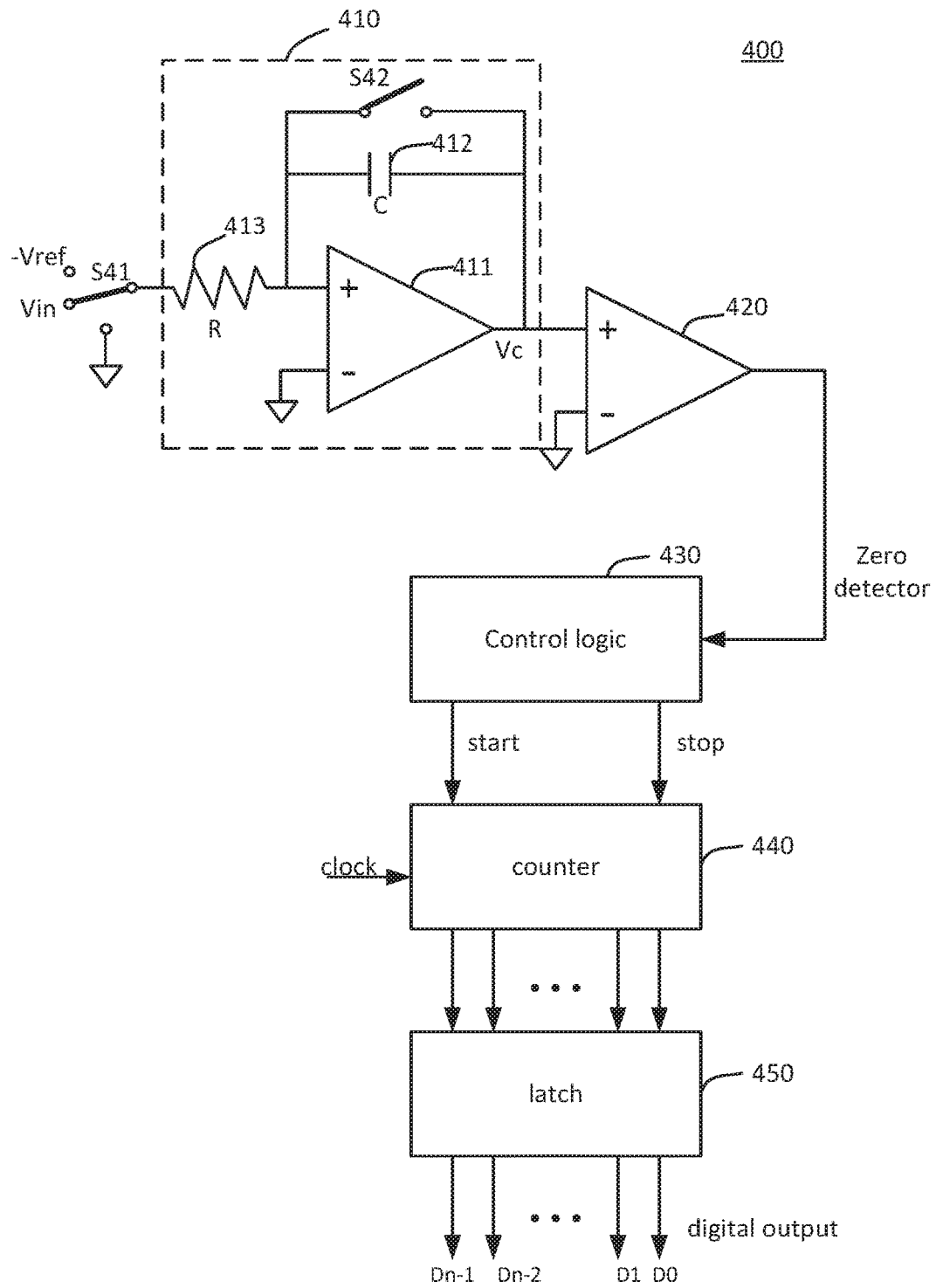
FIG. 4 is a simplified circuit diagram of a dual-slope ADC circuit according to an exemplary embodiment of the present invention.

FIG. 4 is a block diagram of a dual-slope ADC 400 according to an embodiment of the present invention. Dual-slope ADC 400 includes an integrator 410, a comparator 420, a control logic 430, a counter 440, and a latch 450. Integrator 410 includes an operational amplifier (op amp) 411 having a negative input connected to ground and a positive input connected to one end of a capacitor 412 and an output connected to another end of capacitor 412. Integrator 410 also includes a resistor 413 having a first end connected to the positive input of op amp 411 and a second end connected to an input voltage Vin, a voltage reference −Vref, or ground through a switch S41. Integrator 410 also includes a switch S42 connected in parallel to capacitor 412.

At time t<0, S41 is set to ground, S42 is closed, and counter 440 is reset to 0 (zero). At t=0, S42 is open, S41 is set to connect Vin to the input of integrator 410 for a constant predetermined time period T1. Counter 440 starts counting until it overflows and resets after t=T1. Integrator 410 integrates Vin for the time period T1 to provide an output voltage Vc. The output voltage Vc of integrator 410 at t=T1 is Vin (T1/RC), i.e., Vc is linearly proportional to Vin. At t=T1, S41 is set to −Vref, integrator 410 that has the voltage Vc=Vin(T1/RC) stored in it "de-integrates" the voltage Vc such that Vc drops linearly with a constant slope −Vref/RC. Comparator 420 changes its output state when the output voltage Vc of integrator 410 crosses zero and stops counter 440. The value of counter 440 is the digital output value of Vin and is then latched in latch 450. Any error introduced by a component value during the integration period will be canceled out during the de-integration period, so that dual-slope ADC 400 is not sensitive to errors in the component values and can be used as a high accuracy ADC for calibration of any ADCs, such as ADC 110 and ADC 210 shown in respective FIG. 1 and FIG. 2.

Figure 4A:
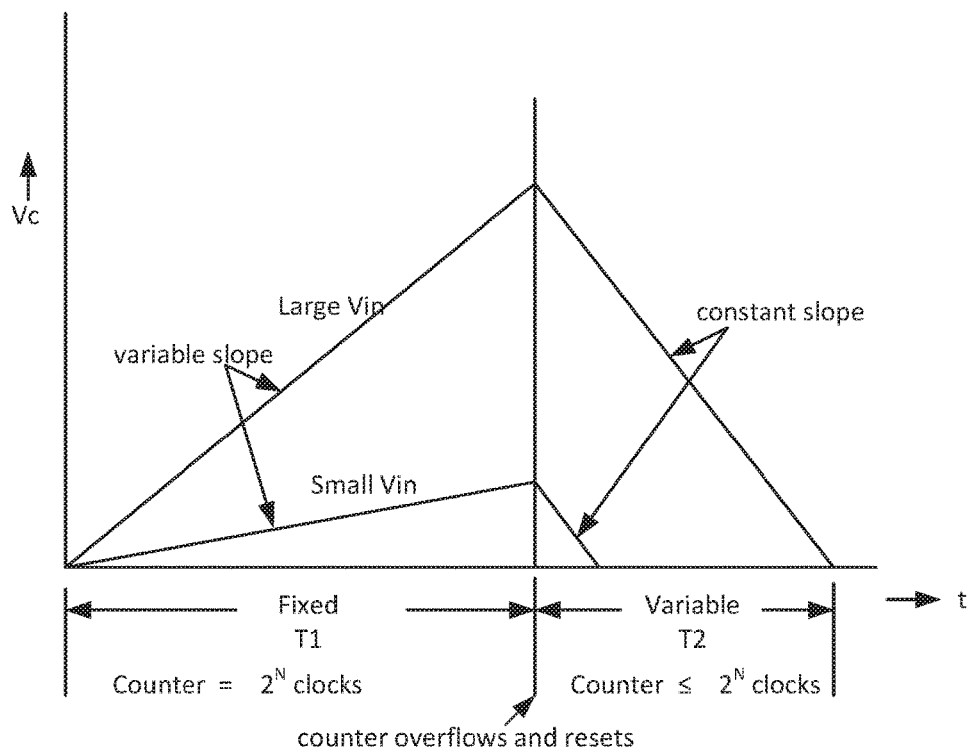
FIG. 4A is a graph illustrating an integration period and a de-integration period of the dual-slope ADC circuit of FIG. 4.

FIG. 4A is a graph illustrating an integration period and a de-integration period of the dual-slope ADC circuit of FIG. 4. During the integration period T1 (which is a fixed predetermined time interval), counter 440 begins to count the clock pulses until it overflows and resets. For example, if counter 440 is an n-bit binary counter, it will take $2^n$ clock pulses to overflow. The slope in the integration (charging) period varies depends from the amplitude level of Vin, i.e., the output voltage Vc is proportional to the amplitude level of Vin. At t=T1, switch S41 connects −Vref to integrator 410 that de-integrates Vc to zero. Since Vref and RC do not change, the slope in the de-integration (discharging) period is also constant. The variable value T2 is basically the digital output of the input voltage Vin. As shown, any error in the slope of Vc (determined by RC) will cancel out since the same integrator is used to calculate T1 and T2. Further, since the same clock is used to measure T1 and T2, errors in the clock (e.g., jitter) also cancel out.

Figure 5:
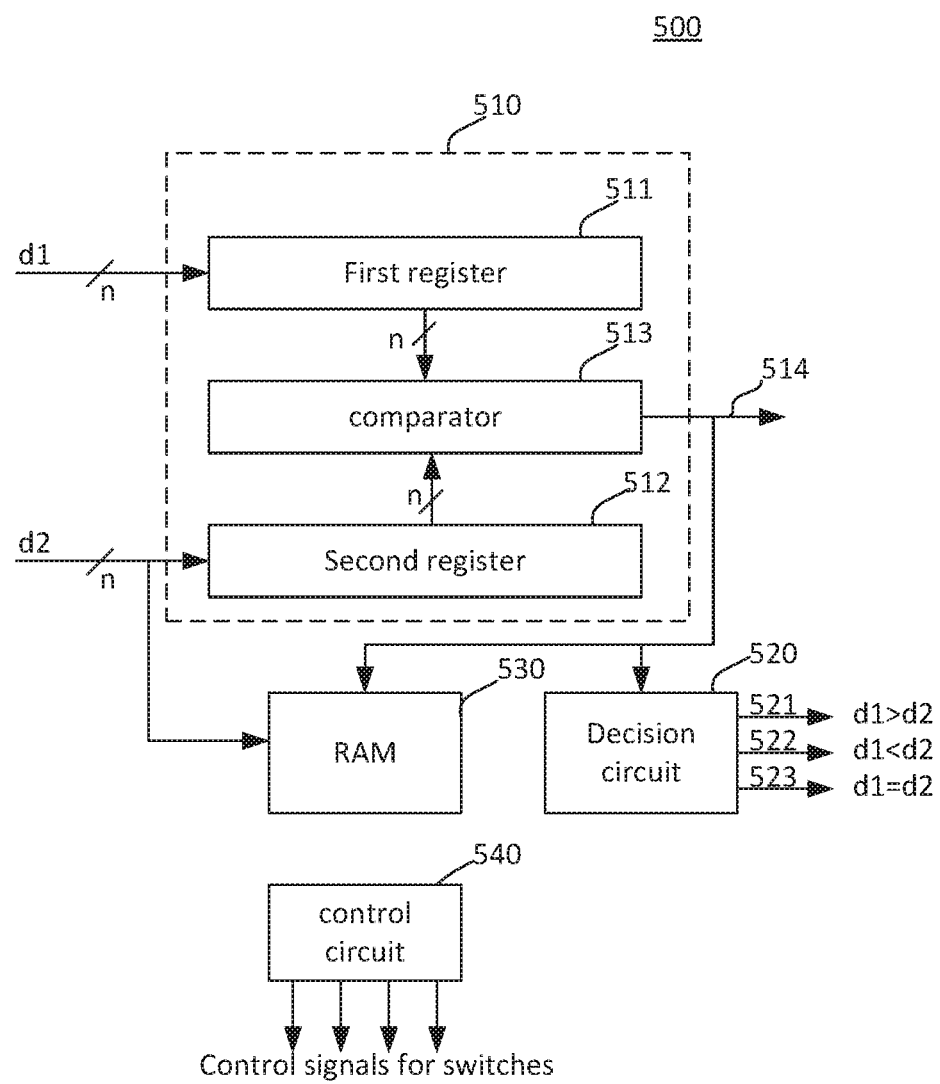
FIG. 5 is a simplified block diagram of a digital engine according to an embodiment of the present invention.

FIG. 5 is a simplified block diagram of a digital engine 500 according to an embodiment of the present invention. Digital engine 500 includes a comparator circuit 510 having a first register 511 for receiving a first digital signal d1, a second register 512 for receiving a second digital signal d2, and a comparator 513 configured to compute a difference 514 between the first digital signal d1 and the second digital signal d2. Digital engine 500 may further include a decision circuit 520 configured to determine that d1>d2, d1<d2, and d1=d2 and provides corresponding output signals 521, 522, and 523 indicating the decision results. Digital engine 500 may also include a memory 530 configured to store difference 514. In one embodiment, the first digital signal d1 is the first digital representation 111 (211) of ADC 110 (210) of FIG. 1 (FIG. 2) that needs to be calibrated, and the second digital signal d2 is the second digital representation 121 (221) of dual-slope ADC 120 (220) of FIG. 1 (FIG. 2). In one embodiment, difference 514 between the first digital signal d1 and the second digital signal d2 may be stored at an address location of memory 530 corresponding to the second digital signal d2. In some embodiments, the decision results may also be stored together with the corresponding difference signals in the memory. As described above, the dual-slope ADC is not sensitive to errors in the component values and is thus a high-precision ADC, so that its digital output signal may be used as a location address for storing the difference between the first digital signal d1 and the second digital signal d2. Digital engine 500 may also include a control circuit 540 configured to provide control signals to turn on and off the switches (e.g., S1, S2, S3, S4) in response to a calibration enable signal (e.g., 150, 250). In one embodiment, digital engine 500 may be implemented using an application specific IC (ASIC), a field programmable gate array (FPGA), a microcontroller, or a CPU including a memory. It is noted that the digital engine, the ADC, the dual-slope ADC, the reference signal circuit and the switches are integrated in a same integrated circuit.

In some embodiments of the present invention, not all of the bits of the ADC need to be adjusted. For example, the digital engine may determine a memory location of the memory location having the largest difference and calibrate only the corresponding bit or bits of the ADC in response to the largest difference and the decision results (e.g., d1>d2 or d1<d2). For example, the digital engine may change one or more specific capacitor values of an SAR ADC, one or more specific resistor values of a flash ADC, or add or subtract the difference to the digital output signal of a sigma-delta DAC based on the decision results. In some embodiments, the ADC circuit of FIG. 1 or FIG. 2 may iteratively repeat the calibration process until the difference between the digital output signal of the ADC and the digital output signal of the dual-slope ADC is within a predetermined range to remove any random errors.

Figure 6:
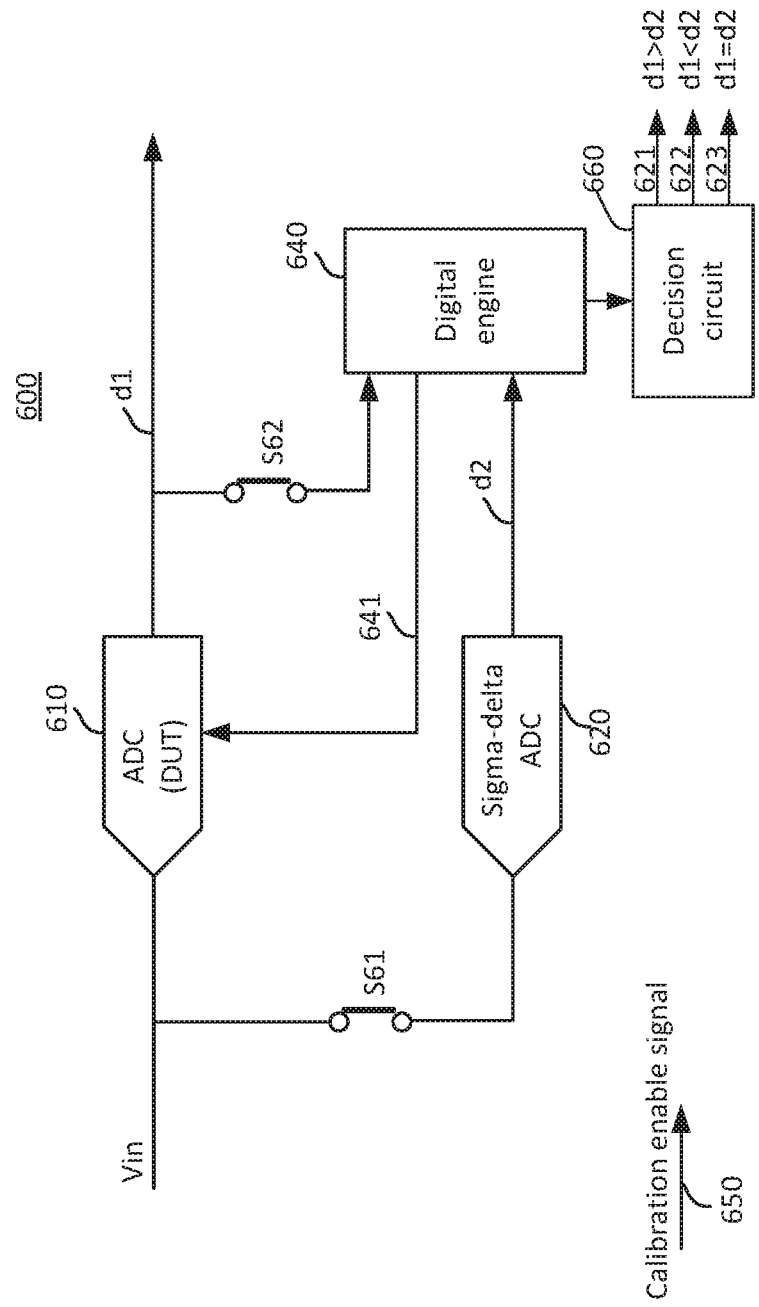
FIG. 6 is a simplified block diagram of an ADC circuit according to yet another embodiment of the present invention.

FIG. 6 is a simplified block diagram of a self-calibrating ADC circuit 600 according to yet another embodiment of the present invention. ADC circuit 600 includes an ADC 610 that needs to be calibrated, a sigma-delta ADC 620, a digital engine 640, and switches S61, S62. In the normal operation mode of ADC circuit 600, switches S61 and S62 are open. Switches S61 and S62 are closed when ADC circuit 600 is in a calibration mode. In one embodiment, switches S61 and S62 may be controlled by the calibration enable signal 650. In another embodiment, switches S61 and S62 may be controlled by digital engine 640. In the calibration mode, sigma-delta ADC 620 is configured to generate a second digital signal d2. Digital engine 640 may operate in the same manner as digital engine 500 described above. In other words, digital engine 640 may include a comparator circuit 610 (not shown) having a first register 611 (not shown) for receiving a first digital signal d1 from ADC 610, a second register 612 (not shown) for receiving a second digital signal d2 from sigma-delta ADC 620, and a comparator 613 (not shown) configured to compute a difference between the first digital signal d1 and the second digital signal d2, and provide a difference signal 641 for calibrating ADC 610. Digital engine 600 may further include a decision circuit 660 configured to determine that d1>d2, d1<d2, and d1=d2 and provides corresponding output signals 621, 622, and 623 indicating the decision results. In some embodiments, decision circuit 660 is embedded within digital engine 640.

Figure 7:
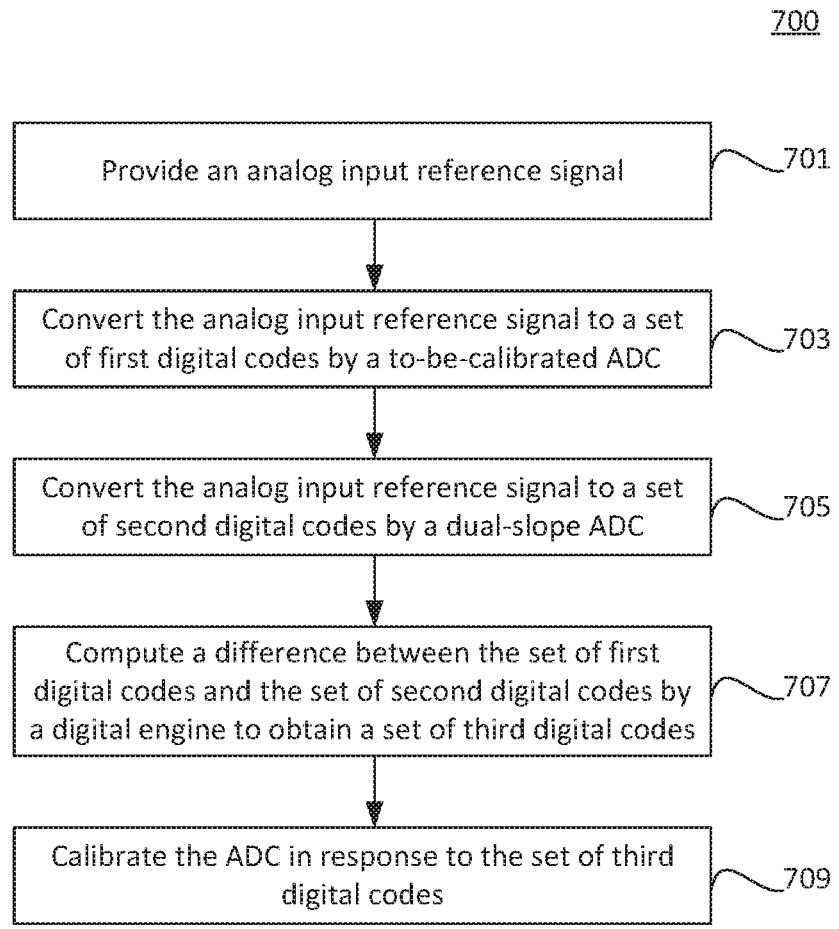
FIG. 7 is a simplified flowchart of a method for calibrating an analog-to-digital converter according to an embodiment of the present invention.

FIG. 7 is a simplified flowchart of a method 700 for calibrating an analog-to-digital converter according to an embodiment of the present invention. Method 700 may include providing an analog input reference signal having linearly increasing voltage levels at block 701. The analog input reference signal may be a plurality of discrete and stable voltage signals or a continuously ramping voltage signal. At block 703, the method includes converting the analog input reference signal to a set of first digital codes by a to-be-calibrated analog-to-digital converter (ADC). At block 705, the method includes converting the analog input reference signal to a set of second digital codes by a dual-slope analog-to-digital converter. At block 707, the method includes computing a difference between the set of first digital codes and the set of second digital codes by a digital engine to obtain a set of third digital codes indicative of a difference signal. At block 709, the method includes calibrating the ADC in response to the set of third digital codes. It is to be understood that the above-described blocks may be performed in a different order. For example, the analog input reference signal may be converted by the ADC and the dual-slope ADC simultaneously or in different sequences. In other words, blocks 703 and 705 may be performed concurrently or in different sequences. According to embodiments of the present invention, the method may be performed by a computer program comprising instructions that are executable by a processing unit. The computer program may be stored on a computer readable medium that is loadable and executable by a CPU. The computer program is stored in the memory and is integrated with the CPU and the ADC, the dual-slope ADC on a same integrated circuit.

In some embodiments, the reference signal may be provided by reference signal circuit 130A shown in FIG. 1A. That is, the reference signal may include a plurality of discrete reference values generated by a plurality of current sources controlled by respective switches flowing through a resistor, and the current sources are integer multiples of a reference current. In one embodiment, the reference current flowing through the resistor is substantially equal to 1 LSB of the reference signal, and the reference signals may be integer multiple of the LSB.

In some other embodiments, the reference signal may be provided by reference signal circuit 230B shown in FIG. 2B. Reference signal circuit 230B includes a stable reference current coupled to a capacitor to provide a linearly ramping voltage signal. In this case, the method may include sampling (quantizing) the reference signal by a sample-and-hold circuit and providing the sampled reference signal to the ADC and the dual-slope ADC for conversion.

Embodiments of the present invention facilitate the calibration of many types of ADC. For example, the difference between the digital output signal of the to-be-calibrated ADC and the dual-slope ADC can be used to calibrate or adjust capacitor ratios of successive approximation register (SAR) ADCs, resistor ratios of flash ADCs, etc.

The method and device of the present disclosure may be implemented in a number of ways. For example, the method and device of the present disclosure may be implemented by software, hardware, firmware, or any combination of software, hardware, and firmware. Those of skill in the art will appreciate that the order of steps of the described method is for illustration only, and the steps of the method of the present disclosure are not limited to the above-described sequences. Further, in some embodiments, the present disclosure may be implemented as a program stored in a recording medium, which includes machine-readable instructions executable by a processor. Thus, the present disclosure also covers a recording medium that stores a program for executing the method according to the present disclosure.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

What is claimed is:

1. A self-calibrating analog-to-digital converter, comprising:
   a reference signal circuit configured to provide a reference signal;
   an analog-to-digital converter configured to generate a first digital representation of the reference signal;
   a dual-slope analog-to-digital converter configured to generate a second digital representation of the reference signal; and
   a digital engine configured to compare the first digital representation with the second digital representation to obtain a difference and output a calibration signal to the analog-to-digital converter in response to the difference,
   wherein the reference signal circuit, the analog-to-digital converter, the dual-slop analog-to-digital converter, and the digital engine are integrated in an integrated circuit.

2. The self-calibrating analog-to-digital converter of claim 1, further comprising:
   a control circuit configured to enable the reference signal circuit, the dual-slope analog-to-digital converter, and the digital engine when a calibration enable signal is asserted, and connect an input analog signal to the analog-to-digital converter when the calibration enable signal is de-asserted.

3. The self-calibrating analog-to-digital converter of claim 2, wherein the control circuit comprises a plurality of electronic switches configured to connect the reference signal circuit, the dual-slope analog-to-digital converter, and the digital engine to a power supply voltage and disconnect the input analog signal from the analog-to-digital converter when the calibration enable signal is asserted, and disconnect the reference signal circuit, the dual-slope analog-to-digital converter, and the digital engine from the power supply voltage and connect the input analog signal to the analog-to-digital converter when the calibration enable signal is de-asserted.

4. The self-calibrating analog-to-digital converter of claim 1, wherein the reference signal comprises a plurality of reference values; the analog-to-digital converter converts the plurality of reference values to a set of first digital codes, the dual-slope analog-to-digital converter converts the plurality of reference values to a set of second digital codes, and the digital engine computes a difference between the set of first digital codes and the set of second digital codes to provide a set of third digital codes corresponding to a difference signal and store the set of third digital codes in a memory.

5. The self-calibrating analog-to-digital converter of claim 4, wherein each code of the set of third digital codes is stored at an address location of the memory corresponding to one of the set of second digital codes.

6. The self-calibrating analog-to-digital converter of claim 4, wherein the reference signal circuit generates the reference signal a plurality of times so that the digital engine provides a plurality sets of third digital codes and performs an averaging algorithm on the sets of third digital codes to obtain an averaged set of third digital codes that is stored in the memory.

7. The self-calibrating analog-to-digital converter of claim 1, wherein the reference signal circuit comprises:
   a current mirror circuit comprising a reference current and a plurality of current mirrors mirroring the reference current;
   a resistor coupled to the current mirror circuit; and
   a plurality of switches disposed between the current mirror circuit and the resistor.

8. A circuit for calibration of an analog-to-digital converter, comprising:
   a ramp reference signal circuit configured to generate a linearly increasing voltage signal;
   a sample-and-hold circuit having an input terminal coupled to the ramp reference signal circuit and configured to generate a plurality of voltage signals having linearly higher voltage levels at an output terminal;
   the analog-to-digital converter coupled to the output terminal of the sample-and-hold circuit and configured to generate a set of first digital codes of the plurality of voltage signals;

a dual-slope analog-to-digital converter coupled to the output terminal of the sample-and-hold circuit and configured to generate a set of second digital codes of the plurality of voltage signals;

a digital engine configured to compute a difference between the set of first digital codes and the set of second digital codes and provide a set of third digital codes corresponding to a difference signal, wherein the ramp reference signal circuit, the sample-and-hold circuit, the analog-to-digital converter, the dual-slope analog-to-digital converter, and digital engine are integrated in an integrated circuit.

9. The circuit of claim 8, further comprising:

a control circuit configured to couple the ramp reference signal circuit to the analog-to-digital converter and to the dual-slope analog-to-digital converter when the analog-to-digital converter is in a calibration mode and couple an analog input signal to the analog-to-digital converter when the analog-to-digital converter is in a normal operation mode.

10. The circuit of claim 9, wherein the ramp reference signal circuit and the dual-slope analog-to-digital converter are disabled such that the ramp reference signal circuit and the dual-slope analog-to-digital converter consume no power when the analog-to-digital converter is in the normal operation mode.

11. The circuit of claim 9, wherein the ramp reference signal circuit, the sample-and-hold circuit, the dual-slope analog-to-digital converter and the digital engine are disabled such that the ramp reference signal circuit, the sample-and-hold circuit, the dual-slope analog-to-digital converter and the digital engine consume no power when the analog-to-digital converter is in the normal operation mode.

12. The circuit of claim 8, wherein the ramp reference signal circuit comprises a reference current and a capacitor.

13. A method for calibrating an analog-to-digital converter, the method comprising:

providing a reference signal having a plurality of linearly increasing voltage levels;

converting the reference signal to a set of first digital codes of the plurality of voltage levels by the analog-to-digital converter;

converting the reference signal to a set of second digital codes of the plurality of voltage levels by a dual-slope analog-to-digital converter;

computing a difference between the set of first digital codes and the set of second digital codes to obtain a set of third digital codes indicative of a difference signal by a digital engine; and calibrating the analog-to-digital converter in response to the set of third digital codes.

14. The method of claim 13, further comprising:

storing the set of third digital codes in a memory, wherein each code of the set of third digital codes is stored at an address location of the memory corresponding to one of the set of second digital codes.

15. The method of claim 13, wherein the reference signal comprises a plurality of reference values provided by a plurality of currents mirroring a reference current and flowing through a resistor under a control of a plurality of switches.

16. The method of claim 15, wherein the analog-to-digital converter and the dual-slope analog-to-digital converter convert the plurality of reference values a plurality of times to average the difference between the set of first digital codes and the set of second digital codes.

17. The method of claim 13, wherein the reference signal is provided by a ramp reference signal circuit comprising a reference current and a capacitor.

18. The method of claim 17, further comprising, prior to providing the reference signal to the analog-to-digital converter and the dual-slope analog-to-digital converter:

sampling the reference signal by a sample-and-hold circuit.

* * * * *